US006567761B1

(12) United States Patent
Modesto et al.

(10) Patent No.: US 6,567,761 B1
(45) Date of Patent: *May 20, 2003

(54) IN-DIE PART MEASUREMENT SYSTEM (75) Inventors: Ronald A. Modesto, Mukwonago, WI (US); Robert Wojczak, Muskego, WI (US); Scott Krupp, New Berlin, WI (US); Yvonne Luzney, Shorewood, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 48 days.

This patent is subject to a terminal disclaimer.

(21) Appl. No.: 09/652,236

(22) Filed: Aug. 31, 2000

(51) Int. Cl.[7] .............................................. H01L 21/00
(52) U.S. Cl. ...................................................... 702/82
(58) Field of Search ..................... 702/82, 33; 425/150, 425/167, 394, 405, 406; 29/798; 264/1.9, 40.9, 2.7; 72/313, 315, 319; 470/167; 700/95, 116–117

(56) References Cited

U.S. PATENT DOCUMENTS

| | | | | |
|---|---|---|---|---|
| 5,299,351 A | * | 4/1994 | Takahashi et al. | 221/11 |
| 5,462,424 A | * | 10/1995 | Kuroyone | 425/150 |
| 5,464,424 A | * | 11/1995 | O'Donnell, Jr. | 606/215 |
| 5,603,871 A | * | 2/1997 | Koseko et al. | 264/1.9 |
| 6,341,516 B1 | * | 1/2002 | Narushima et al. | 72/184 |

* cited by examiner

Primary Examiner—John Barlow
Assistant Examiner—Tung S Lau
(74) Attorney, Agent, or Firm—Quarles & Brady; Alexander M. Gerasimow; William R. Walbrun (57) ABSTRACT

A part measurement system includes a press machine, a part measurement sensor and a press controller. The press machine includes a lower die coupled to an upper die, wherein the lower die includes a top surface supporting a strip of material to be formed into a part after a stripper plate coupled to the upper die contacts the strip of material. The part measurement sensor is located in the lower die and measures a critical dimension of the part while the part is in the lower die. The press controller is coupled to the press machine and the sensor, and controller processes a measurement signal from the part measurement sensor of the critical dimension of the part, compares the measurement signal to a predetermined threshold value, and generates a command signal to the press machine to either reject or accept the part.

32 Claims, 8 Drawing Sheets

IN-DIE PART MEASUREMENT SYSTEM

BACKGROUND OF THE INVENTION

1. Field of the Invention

The present invention relates to a programmable industrial controller configured to measure the critical dimensions of a part while the part is passing through a progressive die machine.

2. Description of the Related Art

Traditionally, progressive die machines include an upper die that is reciprocally moveable with respect to the lower die. A motor imparts rotational motion to the output shaft that, in turn, rotates a eccentrically-mounted pin on a concentrically-mounted plate on an output shaft, thereby tracing a circular path. The rotational motion, in turn, results in a ram mounted on an upper surface of the die to move reciprocally with respect to the lower die.

A rotation of the output shaft of the motor is a "stroke" of the machine that ranges from 0 to 360 degrees. The point at which the pin on the plate of the motor output shaft is located at the uppermost vertical position with respect to the plate is the "zero position" or "top dead center". At the top dead center position, the upper die is positioned with the greatest extent above the lower die. The point at which the pin on the plate of the motor output shaft is located adjacent to the lowermost vertical position with respect to the plate is the "180 degree position". In the 180 degree position, the upper die is positioned adjacent to the lower die and this is the position whereby the forming operations are performed on the web. Between the 0 and 180 degree positions, the upper die is lowered with respect to the lower die and between the 180 and 360 degree positions, the upper die is raised with respect to the lower die.

The upper and lower dies cooperate to define several forming stations therein. Each forming station includes an individual forming tool and a die which are configured and dimensioned so that a particular predetermined operation can be performed on the web fed between the upper and lower dies. The web is typically an elongated strip of material provided as a feedable supply adjacent the machine, such as on a spool. The progressive die machine typically includes a feeding apparatus mounted adjacent the lower die which sequentially advances the web between the upper and lower dies and through each of the forming stations therein.

The number of forming stations is determined by the number of forming operations necessary to form a desired part. A portion of each of the forming tools is located on the upper die and are driven in unison in reciprocal fashion by the ram. Therefore, a forming operation is performed at each forming station during each stroke of the ram.

Following each stroke, the web is advanced so that each portion of the web is positioned within the next successive forming station in the machine. When a portion of the web has passed each forming station in the progressive die machine, a desire part is formed. The last station in the machine typically includes a severing tool and a discharge chute. The severing tool cuts the formed part from the web so that the formed part can fall into the discharge chute and be accumulated therein.

Typically, progressive die machines are plagued with many uncontrollable problems resulting in formed parts that are not within a certain tolerance that have to be thrown away. In many cases, the tolerances that the parts must fall within are of a critical importance and a part that falls outside of the tolerances can cause a catastrophic failure in the system or machine in which the part is ultimately installed. In particular, progressive die machines often experience problems due to changes in the thickness of the web material from which the parts are formed, flaws in the web material, wear on the forming tools and dies, and foreign matter located on the web material. These problems cause the formation of unacceptable parts that often go undetected by the machine and/or its operator until the parts are ultimately manually measured as to whether they are within the specific tolerances.

Due to the difficulties associated with monitoring the formation of a part in a progressive die machine to ensure that all of the parts are within very specific tolerances prior to manufacturing a pile of malformed parts, there is a need for measurement system located within the die that is configured to test every part while it is still in the die to determine whether each part is within the specified tolerance range. There is also a need for a measurement system that is capable of operating within a high-speed press (e.g., 180 to 300 strokes/minute).

While there have been attempts in the past to measure parts in the die of a progressive die machine, these attempts have been either unsuccessful or cost-prohibitive. In particular, one such attempt involves the installation of several transducers including transformers and cores mounted therein on separate upper and lower bodies that are mounted onto the upper and lower dies, respectively. A separate transducer is a "trigger device" that signals the initiation of the measurement process and provides a "zero" reference plane for comparison with the remaining transducers. All of the transducers in both the upper and lower bodies must contact the part in order to generate an error signal indicative of whether the particular part is within acceptable tolerance limits. In this case, significant modifications to both the upper and lower dies are required in order to use this kind of measurement system. Unfortunately, these modifications are costly and difficult to make on a traditional progressive die machine. Thus, there is also a need for a part measurement system that requires only minor modifications to the standard progressive die machine.

SUMMARY OF THE INVENTION

Accordingly, one object of this invention is to provide a part measurement system that includes a press machine, a part measurement sensor and a press controller. The press machine includes a lower die coupled to an upper die, wherein the lower die includes a top surface supporting a strip of material to be formed into a part after a stripper plate coupled to the upper die contacts the strip of material. The part measurement sensor is located in the lower die and measures a critical dimension of the part while the part is in the lower die. The press controller is coupled to the press machine and the sensor, and controller processes a measurement signal from the part measurement sensor of the critical dimension of the part, compares the measurement signal to a predetermined threshold value, and generates a command signal to the press machine to either reject or accept the part.

Another object of this invention is to provide a part measurement system including a press machine having a lower die coupled to an upper die, wherein the lower die includes a top surface supporting a strip of material to be formed into a part after a stripper plate coupled to the upper die contacts the strip of material, a part measurement sensor located in the lower die, wherein the sensor measures a critical dimension of the part, and a press controller coupled to the press machine and the sensor, wherein the controller processes a measurement signal from the part measurement sensor of the critical dimension of the part, compares the measurement signal to a predetermined threshold value, and generates a command signal to the press machine to either reject or accept the part.

Yet another object of this invention is to provide a method of measuring a critical dimension of a part in a press machine. The method includes the steps of feeding a strip of material through the press machine, wherein the machine includes a lower die coupled to an upper die and the lower die includes a top surface supporting the strip of material, forming the strip of material into the part, wherein a stripper plate coupled to the upper die contacts the strip of material and the upper die punches the strip of material, measuring the critical dimension of the part with a part measurement sensor located in the lower die, and processing a measurement signal from the part measurement sensor of the critical dimension of the part, wherein a press controller compares the measurement signal to a predetermined threshold value, and generates a command signal to the press machine to either reject or accept the part.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE PREFERRED EMBODIMENTS

In-die Part Measurement System

Figure 1:
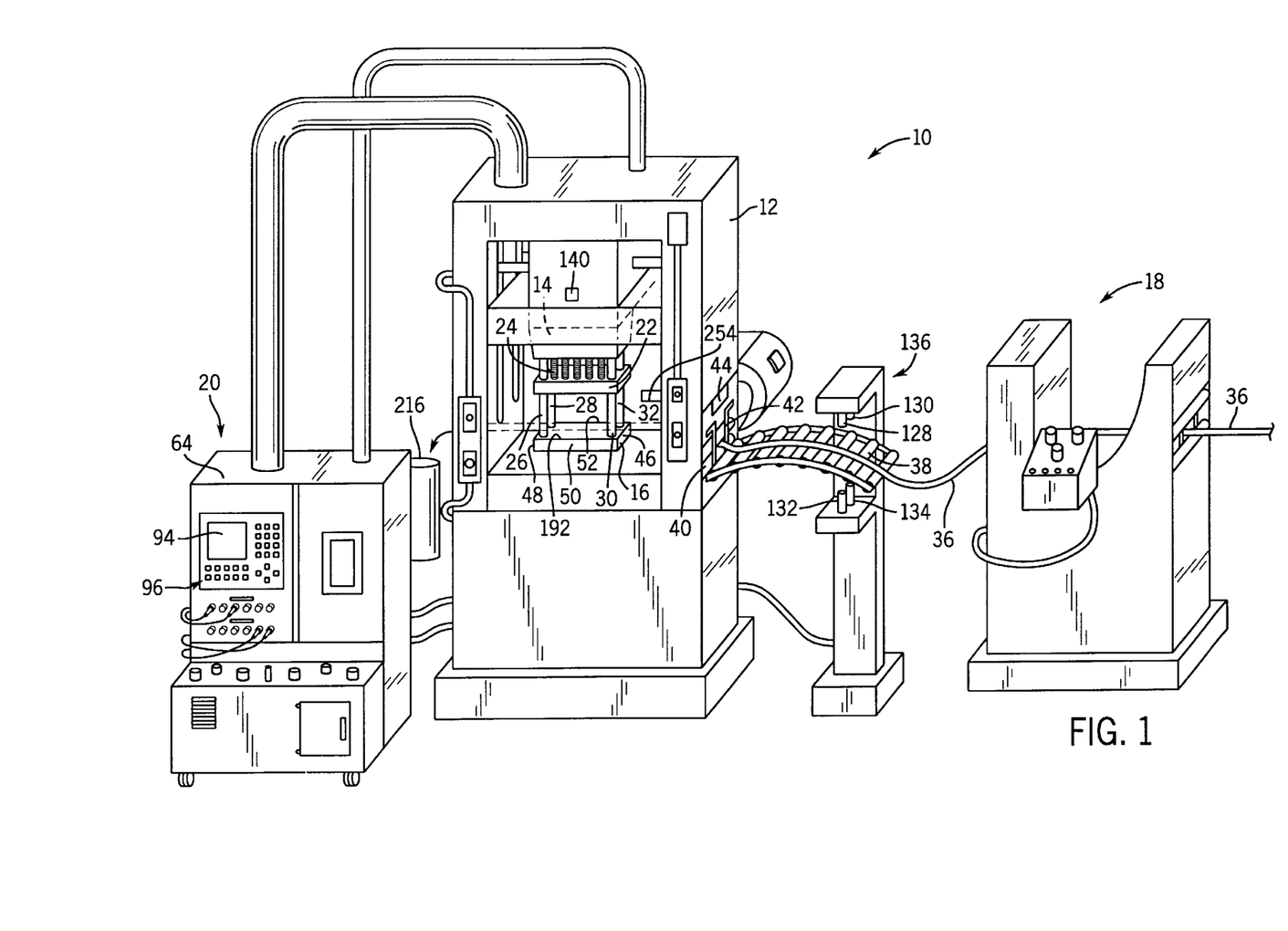
FIG. 1 is a diagram illustrating a press control system according to the present invention.

Referring to the drawings and to FIG. 1 in particular, a press control system 10 includes a progressive die machine 12 having an upper die 14 and a lower die 16, a strip monitoring station 18, and a press control system 20. Upper die 14 is connected to a ram (not shown) that is interconnected to a conventional motive apparatus that imparts a reciprocal motion to the ram. The reciprocal motion imparted to the ram, in turn, reciprocates upper die 14 with respect to lower die 16 in accordance with what is generally known to those skilled in the art relating to progressive die machines. A stripper plate 22 is mounted to upper die 14 and includes a series of springs 24 therebetween. A first post 26, a second post 28, a third post 30 and a fourth post 32 are mounted on top surface 34 of lower die 16. Stripper plate 22 rides along posts 26, 28, 30 and 32 that are also mounted to upper die 14. A series of punches (not shown) are mounted in upper die 14. As stripper plate 22 contacts a strip of material 36 and springs 24 being to compress, the punches begin to protrude from upper die 14 through corresponding apertures in plate 22 (not shown).

Strip 36 is fed from a coil (not shown) through monitoring station 18, up onto a series of rollers 38, through a set of feeder rollers 40, into an opening 42 and through upper and lower dies 14 and 16, respectively. Several forming stations are formed on upper and lower dies 14 and 16 (not shown). Additionally, machine 12 further includes a material feeding system 44 controlling the speed of strip 36. Strip 36 is advanced between upper and lower dies 14 and 16 in discrete steps so that a particular portion of strip 36 is positioned adjacent each of the forming stations. As is well-known in the art, the forming stations perform a particular tooling, contouring or other forming operation on a particular portion of strip 36. It will be understood that this invention is not limited to a progressive die machine as illustrated in FIG. 1. This invention also applies to other presses including lamination presses.

Figure 2:
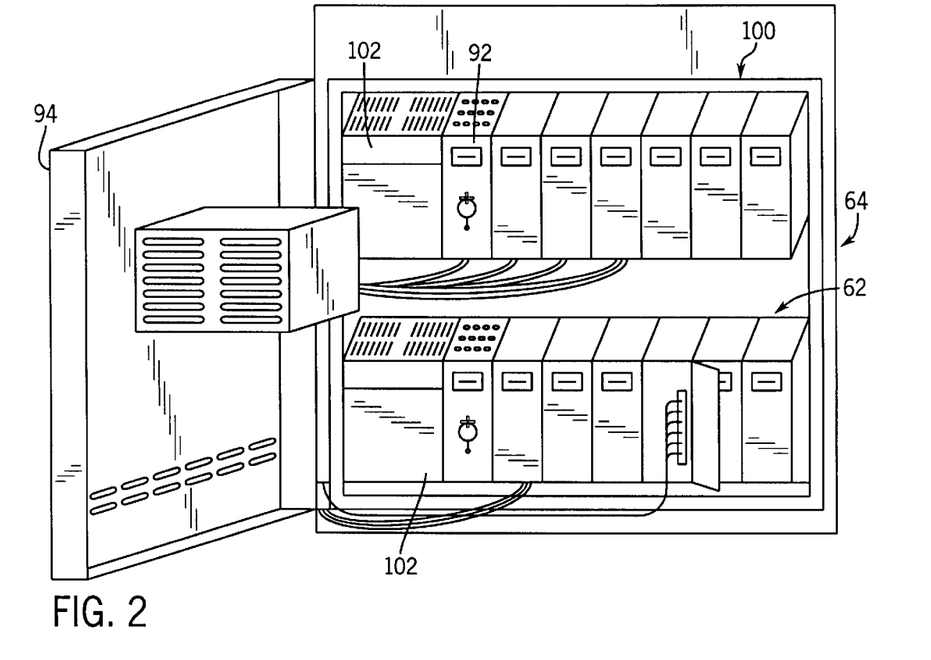
FIG. 2 is a perspective view of an industrial controller according to the present invention.
Figure 14:
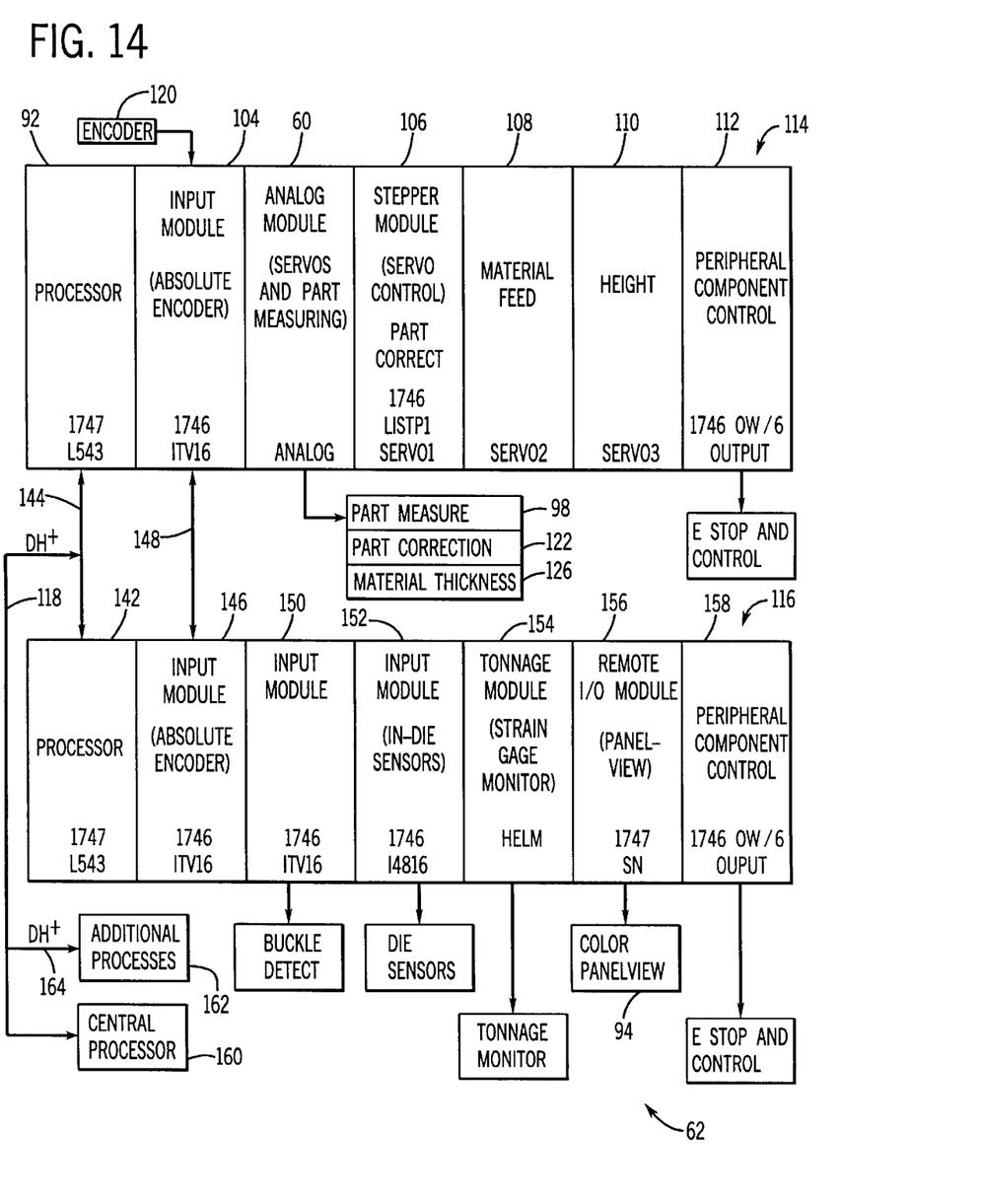
FIG. 14 is a press monitoring and control system according to the present invention.

Lower die 16 includes a first end 46, a second end 48, a front face 50 and a back face 52. In the preferred embodiment of the present invention, a measurement sensor 54 is received in a bore 56 formed in back face 52 adjacent second end 48. Measurement sensor 54 is an analog output proximity switch coupled via wire 58 to an analog input module 60 located on a rack 62 of an industrial controller 64 (FIGS. 2 and 14).

Sensor 54 is isolated from background metal using a non-ferrous material. Similarly, the dimension to be measured is also isolated by a non-ferrous material (e.g., a hardened material such as G10 or Lexan). Sensor 54 can use light, sound, magnetic fields, or other forces to detect or measure the distance to a targeted dimension 66 on a part 68 formed from strip or web 36 (FIG. 8) without contact between sensor 54 and part 68. In the preferred embodiment of the present invention, sensor 54 is an optical sensor utilizing triangulation of reflected light to measure the distance between a measuring end 70 of sensor 54 and targeted dimension 66 of part 68 (e.g., Turck Model No. N18-M18-LIU). Sensor 54 measures the density of strip 36 and compares the density to known density parameters corresponding to the particular metal used for forming part 68 (e.g., copper, aluminum, steel). In addition to calculating an angle 72 in targeted dimension 66 of part 68, sensor 54 is also able to detect a blemish, burr or any other abnormality formed on strip 36, and according reject part 68. Therefore, sensor 54 maintains consistent and accurate output at the high speeds required of progressive die machine 12 (e.g., a normal operating range of 180–300 strokes/minute).

Figure 3:
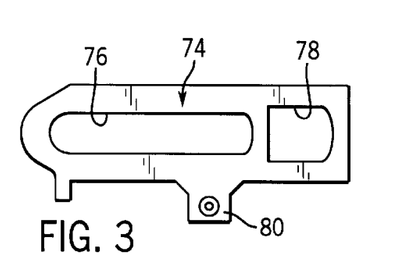
FIG. 3 is a top plan view of a formed part according to the present invention.
Figure 4:
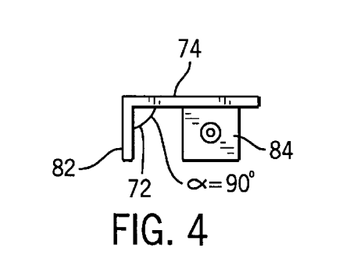
FIG. 4 is an end view of the formed part of FIG. 3 according to the present invention.
Figure 5:
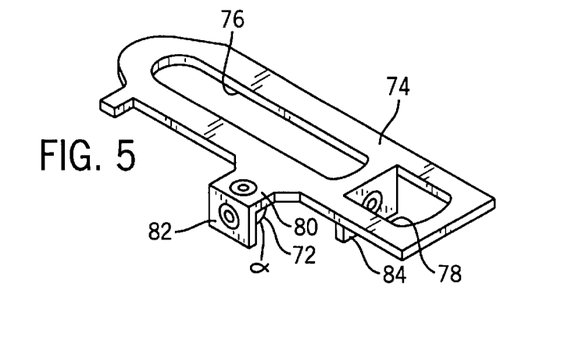
FIG. 5 is a perspective view of the formed part of FIG. 3 according to the present invention.
Figure 6:
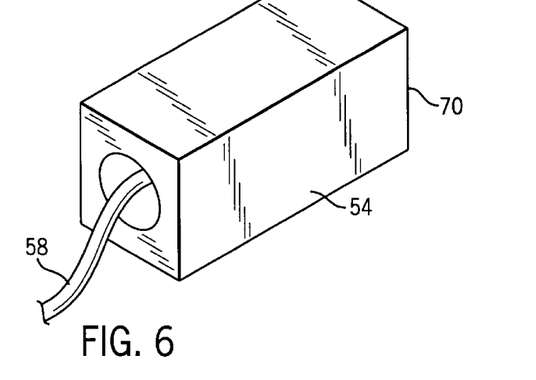
FIG. 6 is a perspective view of a measurement sensor according to the present invention.

As illustrated in FIGS. 3–5, part 68 includes, for example, a top plate 74, a first aperture 76, a second aperture 78, a projection 80 planar with top plate 74, a first downwardly projecting member 82 at a 90 degree angle to the plane of top plate 74, and a second downwardly projecting member 84 extending from second aperture 78 and perpendicular to first member 82.

Figure 8:
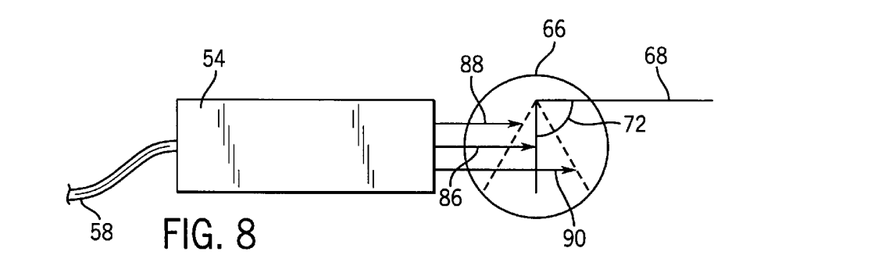
FIG. 8 is a diagram illustrating the distance between a sensor and a formed part according to the present invention.

Referring to FIG. 8, sensor 54 detects whether the 90 degree critical angle 72 formed between first member 82 and top plate 74 of part 68 is 90 degrees plus or minus a predetermined tolerance parameter provided by controller 64. If first member 82 forms a 90 degree angle with top plate 74 within the certain tolerance parameter, a distance 86 measured by sensor,54 will indicate that part 68 is within the acceptable tolerance limits. If, however, first member 82 forms an angle with top plate 74 that is greater than 90 degrees and outside of the certain tolerance, a distance 88 measured by sensor 54 will indicate that part 68 is not within the acceptable tolerance limits. Similarly, if first member 82 forms an angle with top plate 74 that is less than 90 degrees and outside of the certain tolerance, a distance 90 measured by sensor 54 will indicate that part 68 is also not within acceptable tolerance limits.

Sensor 54 transmits an output signal to industrial controller 64 through a feedback loop in a processor 92 to determine whether part 68 is within acceptable tolerance limits. If part 68 is not within acceptable tolerance limits, processor 92 sends a signal to discard the bad part. An operator monitors all operations of measurement system 10, and specifically press 12, via a display 94 (e.g., Rockwell Automation Panelview Model No. 2711-B6C1) coupled to controller 64. The operator is able to control the operation of press 12 using a series of inputs 96. In the preferred embodiment of the present invention, the operator is notified via a shutdown signal from controller 64 to display 94 to shut down press 12 if three consecutive parts are rejected. Alternatively, press 12 may be programmed via processor 92 to automatically shut down after a predetermined number of parts are rejected. In this case, the operator then stops the press and retunes sensor 54 prior to starting press 12 again.

In general, industrial controllers are special purpose computers used for controlling industrial processes and manufacturing equipment such as press 12. Under the direction of a stored program in processor 92, industrial controller 64 examines a series of inputs, reflecting the status of the controlled process, and changes a series of outputs controlling the industrial process. The inputs and outputs may be binary (on/off) or analog (a reading/value in a continuous range).

Industrial controller 64 differs from a conventional computer in that the hardware of industrial controller 64 changes substantially for different applications. This reconfiguration is facilitated by assembling industrial controller 64 from a number of standard modules, each performing a different function (e.g., in-die sensing input module 98). Different combinations of modules are selectively linked together on a backplane 100 or connected together by one or more communication links to customize industrial controller 64 to the particular process or equipment being controlled.

Industrial controller 64 suitable for use with the present invention includes rack 62 holding a series of functional modules electrically interconnected by backplane 100 running along the rear of rack 62. Each module may be individually removed from rack 62, thereby disconnecting it from backplane 100 so that industrial controller 64 may be customized as to which modules are used.

Press Control System

In the preferred embodiment of the present invention, controller 64 of press control system 10 includes a power supply module 102 that receives an external source of power (not shown) and provides regulated voltages to the other modules by means of conductors on backplane 100, processor 92, an input module 104, analog module 60, a stepper module 106, material feed module 108, shut height adjustment module 110, and a peripheral component control module 112. These modules are housed in an upper rack 114 that communicate with a lower rack 116 via a datahighway plus bus 118.

Figure 12:
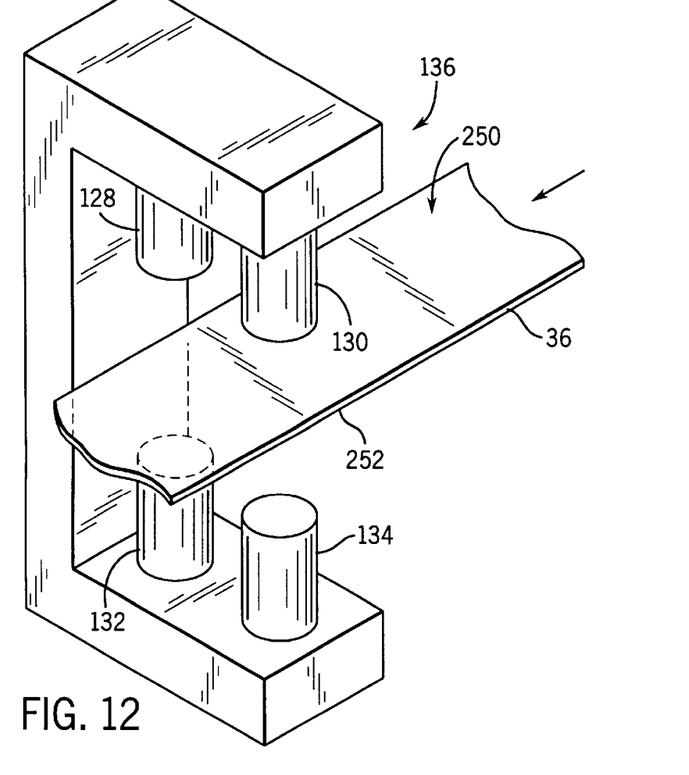
FIG. 12 is a system to monitor the thickness of a strip of material according to the present invention.

Processor 92 is a small logic controller (SLC) (e.g., Allen-Bradley SLC 504). Input module 104 is coupled to an absolute encoder 120 that is a 365 degree absolute encoder generating a measurement of pulses per revolution. Encoder 120 communicates the exact position of the press at all times. Analog module 60 supports 8 inputs including measurement input 98 corresponding to sensor 54, an in-die part correction input 122, and a material thickness input 126 corresponding to a first sensor 128, a second sensor 130, a third sensor 132 and a fourth sensor 134 of a material thickness system 136 (FIGS. 1 and 12). Stepper module 106 controls a corresponding part correction servo 138 (FIG. 9), material feed module 108 controls corresponding feed servo 44, and shut height adjustment module 110 controls a corresponding shut height servo 140 (FIG. 1). Component control module 112 includes 16 control outputs for stopping the press and, for example, an oiler to lube the press at given intervals.

Processor module 92 processes information provided by communication and I/O modules according to a stored program contained in the memory of processor module 92 (not shown).

A communication module provides a high speed interface between backplane 100 and an external link which may be connected to a workstation configured to program industrial controller 64 and display various diagnostic messages and diagrams.

Lower rack 116 includes a processor 142 communicating with processor 92 over a datahighway bus 144, an input module 146 communicating with input module 104 over a datahighway bus 148, an input module 150 to detect buckling of material 36, an input module 152 including 6 in-die sensors to detect whether material 36 is in correct position, a tonnage module 154 to measure the strain on press 12 with each hit, a remote I/O module 156 is connected to display 94, and a peripheral component control module 158. Upper and lower racks 114 and 116 communicate with a central processor 160 via datahighway bus 118. Upper and lower racks 114 and 116 may also communicate with other processors 162 via a datahighway bus 164.

Figure 9:
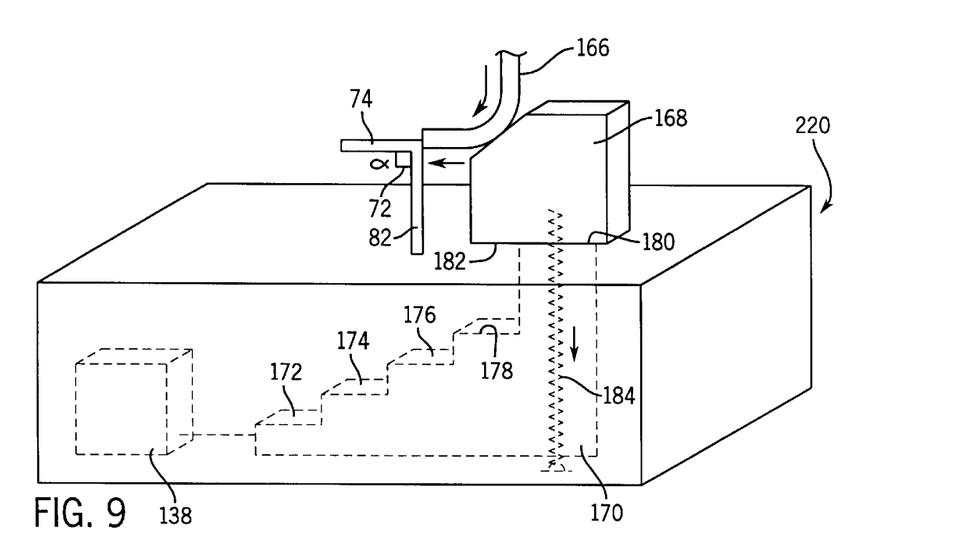
FIG. 9 is a perspective view of a forming rail according to the present invention.

Referring to FIG. 9, a knocker 166 attached to upper die 14 is deflected from a forming rail 168 onto plate 82 to form angle 72 that is preferably 72. The formation of angle 72 results from the point of contact between knocker 166 and part 74. The point of contact between knocker 166 and 74 is adjusted by controller 64 via servo 138 controlled by part correction module 106, thereby changing the angle 72. Servo 138 is connected to s stepper 170 that includes a first step 172, a second step 174, a third step 176, a fourth step 178, and a fifth step 180. In the preferred embodiment of the present invention, servo 138 is in a "home" position when third step 176 abuts a bottom 182 of forming rail 168. Forming rail 168 is biased downwardly against stepper 170 by a resilient spring 184.

Figure 10:
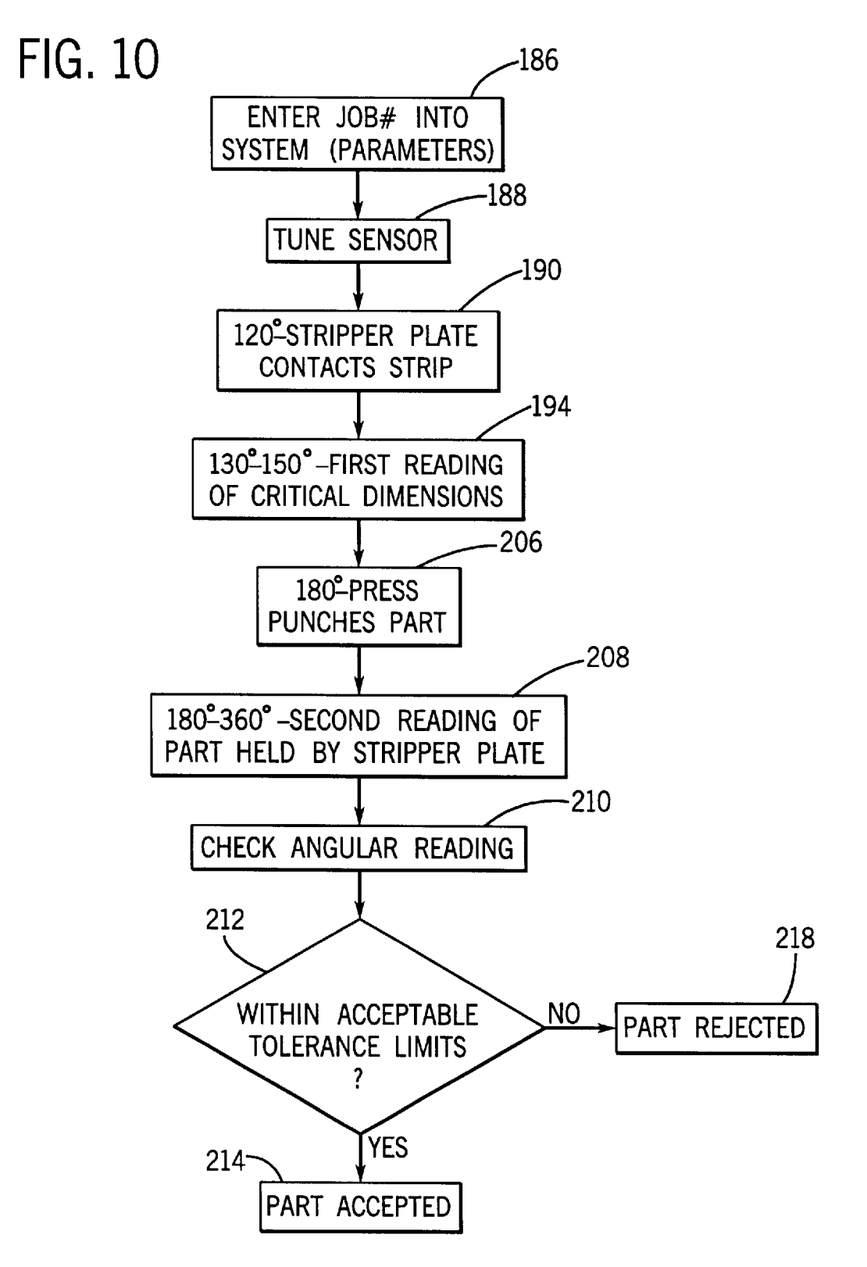
FIG. 10 is a flow chart illustrating the in-die process for measuring a formed part according to the present invention.

Referring to FIG. 10, the in-die measuring process will now be described. In a step 186, a die job number is entered by the user via inputs 96 and certain parameters relating to the specific job are displayed for the user's review on display 94. In a step 188, a control part is placed in press 12 to check the integrity of press control system 10 and sensor 54 is tuned as necessary using tuning methods that are well-known in the art. Display 94 provides visual feedback on the angular deflection of part 74. Controller 64 includes all of the necessary parameters, limits and press reading point angles that will be engaged when press 12 is started that correspond to the particular job to be performed.

Figure 7:
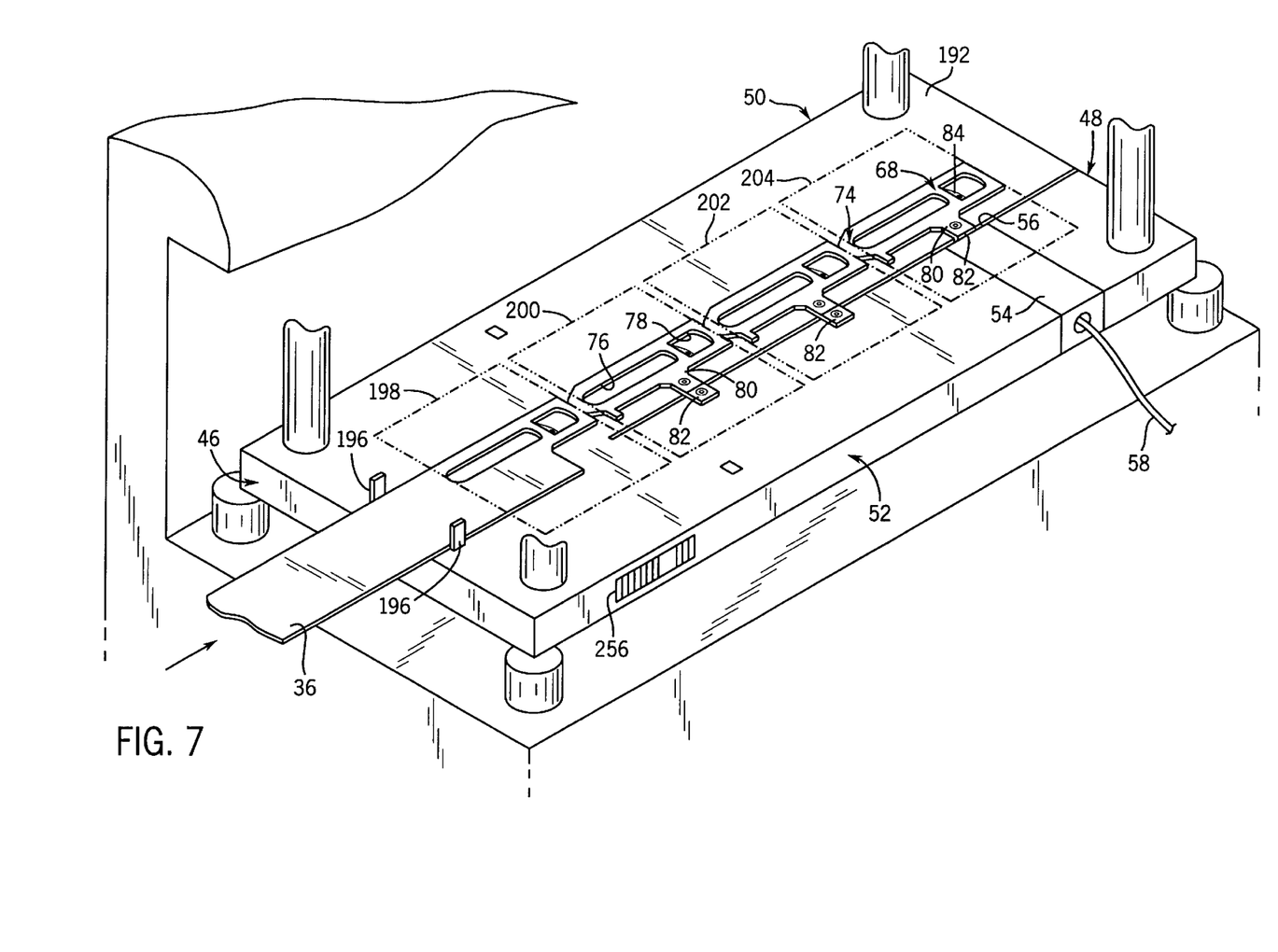
FIG. 7 is a partial view of a bottom die including a formed part according to the present invention.

In a step 190, at approximately 120 degrees into the stroke cycle, stripper plate 22 contacts strip 36 and forces strip 36 onto a lower die surface 192. In a step 194, at approximately 130–150 degrees into the stroke cycle, sensor 54 obtains a first reading of the critical dimension of part 68. Referring to FIG. 7, Strip 36 is held in place with guides 196 having notches configured to guide the edges of strip 36 through press 12. At a first station 198, the outline of part 68 is formed. At a second station 200, projection 82 is formed at 90 degree angle 72 to the plane of projection 80. At a third station 202, additional apertures are formed. A fourth station 204 is a "dead station" where part 68 is fully formed. All measurements by sensor 54 take place when part 68 is in station 204.

In a step 206, at approximately 180 degrees, upper die 14 punches part 68. At a step 208, at approximately 180–360 degrees into the stroke cycle, sensor 64 obtains a second reading of the critical dimension 66 of part 68 while part 68 is still retained by stripper plate 22 in dead station 204. In a step 210, the first reading is compared to the second reading to ensure the accuracy of the sensed dimension. At a step 212, a determination is made whether the critical dimension of part 68 is within acceptable tolerance levels provided by controller 64. If part 68 is within acceptable tolerance levels, the part is accepted in a step 214. If, however, part 68 is not within acceptable tolerance levels, part 68 is tracked by controller 64 through the die to an output area 216 and rejected at a step 218.

In the preferred embodiment of the present invention, the input by sensor 54 is moved into a floating point (A) word and then divided by 100 and placed into another floating point (B) word. The result is scaled by multiplying 0.5882352 (C) that results in a percentage used as an angular deviation value. For example:

I:4.1=13502 and moved into F8:0=13502 (A)
F8:0=13502/100 moved into F8:1=135.02 (B)
F8:1=135.02*0.5882352 moved into F8:2=79.42352 (C) (79 degrees)

Therefore, a mid-range of deflection is calculated. In the present invention, 90 is the ideal midpoint, so sensor 54 is moved until 90 is achieved. Thereafter, the results of F8:1 is subtracted by itself (now a constant), resulting in a zero deviation point to be tuned:

F8:1=135.02−135.02=0 (O:5.6)

The result of the subtraction is displayed to the user on display 94. This result will deviate from the original setting depending on the deflected angle of part 68. The rungs are always active to continuously take readings, but the results are reviewed as needed. As the die starts its downward stroke and compresses strip 36 onto lower die surface 192, several readings are taken prior to the die punching part 68. Absolute encoder 120 sets a bandwidth to precise press angular readings. After strip 36 is punched and the die begins an upward stroke, another bandwidth is set to cross compare the original bandwidth with the new bandwidth.

Auto-correcting Part Measurement System

After obtaining measurements of part 68 and determining whether part 68 is within certain tolerance limits, the measurement signal is fed back to controller 64. Controller 64 then sends a control signal to servo motor 138 that adjusts forming rail 168 (FIG. 9). Servo 138 is isolated from the shock induced through the tooling.

Figure 11:
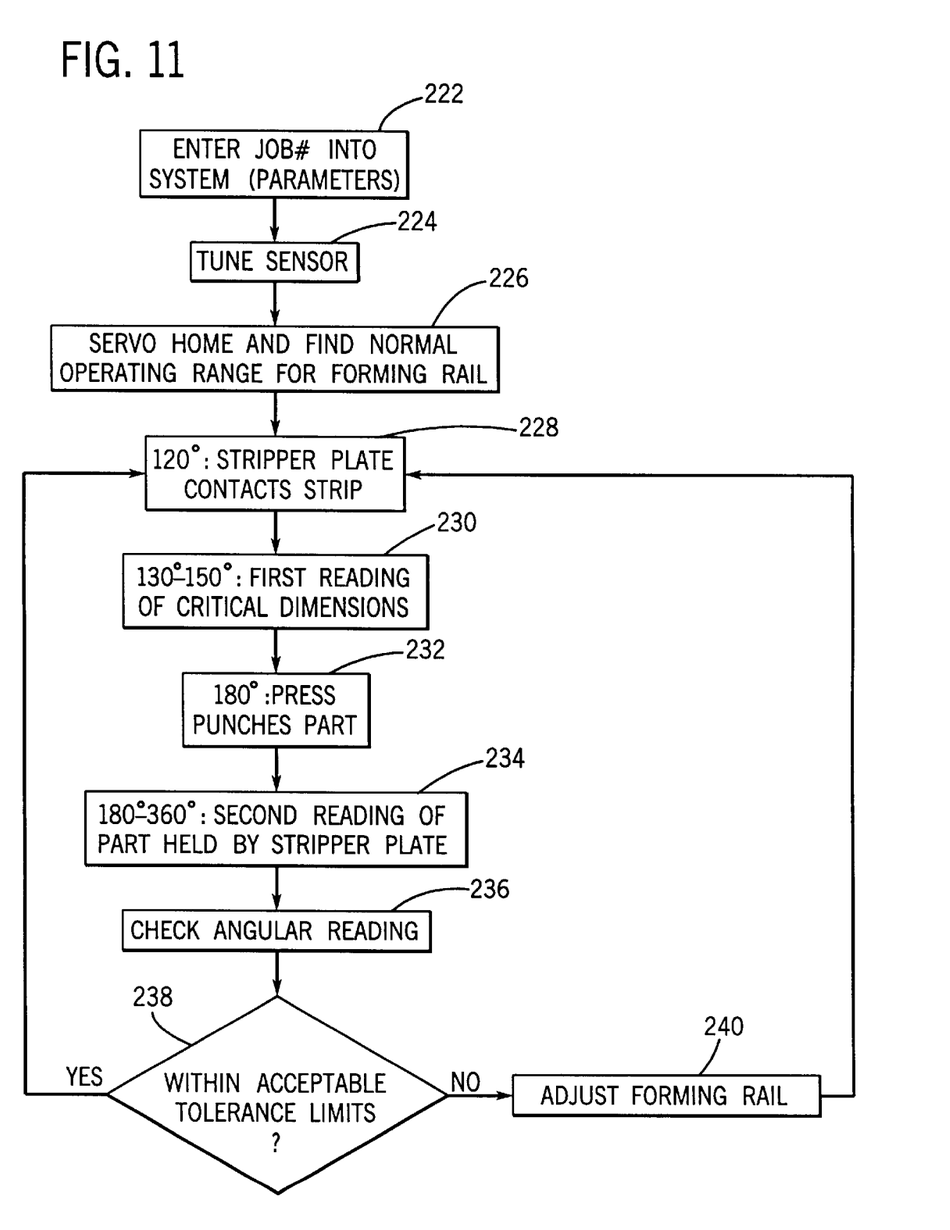
FIG. 11 is a flow chart illustrating the in-die correction of a part according to the present invention.

The operation of an auto-correcting part measurement system 220 will now be described as illustrated in FIG. 11. In a step 222, a die job number is entered by the user via inputs 96 and certain parameters relating to the specific job are displayed for the user's review on display 94. In a step 224, a control part is placed in press 12 to check the integrity of auto-correcting part measurement system 220 and sensor 54 is tuned as necessary using tuning methods that are well-known in the art. Display 94 provides visual feedback on the angular deflection of part 68. Controller 64 includes all of the necessary parameters, limits and press reading point angles that will be engaged when press 12 is started that correspond to the particular job to be performed.

In a step 226, servo 138 homes itself to third step 176 and finds a normal operating range for forming rail 168 corresponding to part 68. In a step 228, at approximately 120 degrees into the stroke cycle, stripper plate 22 contacts strip 36 and forces strip 36 onto lower die surface 192. In a step 230, at approximately 130–150 degrees into the stroke cycle, sensor 54 obtains the first reading of the critical dimension of part 68 while part 68 is at dead station 204. In a step 232, at approximately 180 degrees, upper die 14 punches part 68. At a step 234, at approximately 180–360 degrees into the stroke cycle, sensor 54 obtains a second reading of the critical dimension 66 of part 68 while part 68 is still retained by stripper plate 22 in dead station 204. In a step 236, the first reading is compared to the second reading to ensure the accuracy of the sensed dimension. At a step 238, a determination is made whether the critical dimension of part 68 is within acceptable tolerance levels provided by controller 64. If part 68 is within acceptable tolerance levels, forming rail 168 is not adjusted and the press 12 continues to step 228. If, however, part 68 is not within acceptable tolerance levels, in a step 240 controller 64 adjusts forming rail 168 based on the measurement signal from sensor 54 prior to proceeding to step 228 and forming the next part. The accuracy of servo 138 ensures that the rotary to linear motion is held within a very tight tolerance (e.g., tenths of a degree).

Storage buffers and printing capabilities of controller 64 allow a user to produce a detailed report including exact measurements of every part 68 formed in press 12 for quality control purposes. Auto-correcting part measurement system 220 ensures all parts produced from press 12 that are shipped to a consumer are within a specified tolerance level. If, however, any part deformation occurs that causes part 68 to become out of tolerance, there is a record of the exact measurement of that particular part when it came out of press 12 and other part handling processes can be investigated.

System for Measuring Material in a Press

Whether in a progressive die press 12 or in the case of a lamination die wherein stamped parts are stacked together, it is necessary to obtain accurate measurements of the thickness of strip 36. Unfortunately, manufacturers cannot guarantee uniform thickness of strip 36 in any given coil of material. In the normal stamping process, controller 64 assumes that strip 36 is within a specified tolerance. If, however, the thickness of strip 36 is not within a specified tolerance, the press will produce a series of unacceptable parts.

Figure 13:
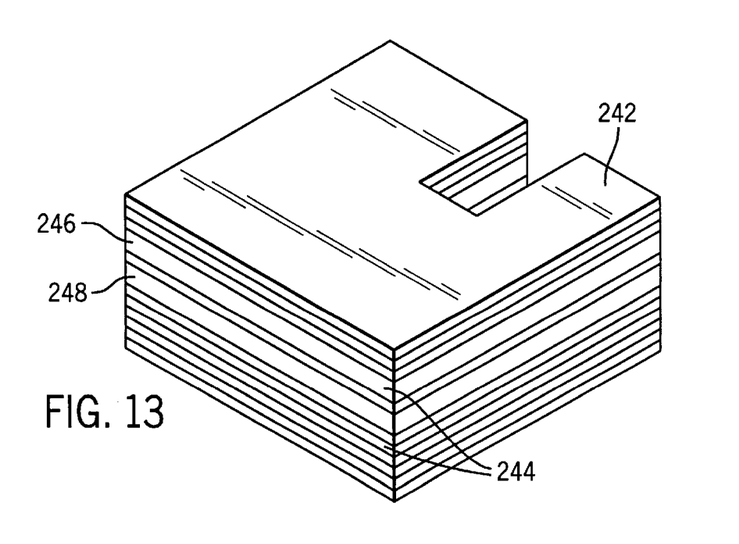
FIG. 13 is a multi-layer part (laminate) formed from a series of individual plates in a lamination die according to the present invention.

For example, as illustrated in FIGS. 12 and 13, in the case of a lamination die, a part 242 includes several layers of individual punched plates 244. If strip 36 is out of tolerance, there is an additive error to part 242 either to the plus or minus side of the finished part. For example, a thicker plate 246 that is out of tolerance will result in part 242 being rejected because it is not within the predetermined limits set up controller 64. If a second plate 248 is also out of tolerance and included in part 242, the thickness of second plate 248 will result in part 242 deviating even farther away from the acceptable limits.

In traditional systems to measure the thickness of strip 36, contact sensors such as LVDTs are often used. Unfortunately, such contact sensors generate inaccurate readings due to vibrations of press 12 and coatings that manufacturers often put on strip 36 that contribute to the overall error in the reading.

As illustrated in FIG. 12, in the preferred embodiment of the present invention, analog sensors 128 and 130 are disposed above a top surface 250 of strip 36 and analog sensors 132 and 134 are disposed below a bottom surface 252 of strip 36. Sensors 128, 130, 132 and 134 are housed in device 136. Measurement signals from sensors 128, 130, 132 and 134 are read and processed by controller 64. The measurement signals may be averaged and/or some of the measurements may be accepted or rejected depending on the error tolerance parameter set within controller 64. After processor 92 analyzes the measurement signals, controller 64 sends appropriate control signals to continue or stop stacking plates 244 onto part 242 to ensure that part 242 remains within acceptable tolerance levels. Display 94 provides the user with output indicative of real-time analog thickness measurements of strip 36. These measurements can be analyzed and printed by processor 92 for any given process.

The traditional linear variable-differential transducers (LVDTs) used in the prior art are contact-based sensors that are unreliable insofar that any imperfection or coating on strip 36 results in inaccurate measurements. LVDTs are also subject to inaccuracies due to vibration of press 12. On the contrary, non-contact analog sensors 128, 130, 132 and 134 provide reliable and consistent measurements of strip 36 and are not subject to the same errors of contact-based sensors.

Automatic Material Feed System

The normal stamping process assumes strip 36 is being fed through the die at a precise rate and speed. In the present invention, material feed servo 44 is mounted on rollers 40. A user enters a particular job number into controller 64 via inputs 96 and processor 92 cooperates with material feed module 108 to determine the necessary rate and speed parameters corresponding to the particular job. The user is also able to jog strip 36 through press 12, set up batch control, batch counts, feed angle and inches fed per minute. These parameters and run-time data are stored in central processor 160 and recalled as needed based on the particular job number entered by the user.

Automatic Shut Height System

The normal stamping process places the responsibility of setting the height of the die (known as the "shut height") on the user in order to achieve the necessary distance between upper die 14 and lower die 16 for a particular job. In particular, the user adjusts the shut height with a wrench inserted for each individual die run on press 12. In the preferred embodiment of the present invention, the shut height is adjusted with servo 140 controlled by height module 110 in controller 64. Shut height module 110 communicates with processor 92 to automatically adjust the shut height based on the parameters corresponding to the particular job number entered by the user into controller 64 via inputs 96. The user enters the job number, the height servo is sent to a predefined position (e.g., "home") and the user can "jog" or incrementally adjust the height to a particular point. These parameters are then subsequently recalled whenever the particular job number is reentered by the user into controller 64. Central processor 160 will alarm the user if a particular die is set beyond a normal operating range due to the die becoming dull or some other factor. After the die is sharpened, the processor 92 sets the shut height for the particular job based on default parameters corresponding to the particular job number.

Die Identification System

The normal stamping process places the responsibility of finding and placing the correct die into the press corresponding to a particular job. An internal scanner 254 located in press 12 automatically scans a bar code 256 located on face 52 of lower die 16 to verify that the correct die is inserted in press 12 that corresponds to the job number entered into controller 64 via input 96 by the user. If bar code 256 does not correspond to the job number entered by the user, controller 64 via processor 142 will signal central processor 160 to freeze press 12 until the correct die is inserted in press 12.

While the detailed drawings, specific examples, and particular formulations given describe exemplary embodiments, they serve the purpose of illustration only. Therefore, the configurations shown and described are not limited to the precise details and conditions disclosed. Furthermore, other substitutions, modifications, changes and omissions may be made in the design, operating conditions and arrangement of exemplary embodiments without departing from the spirit of the invention as expressed in the appended claims.

What is claimed is:

1. A part measurement system comprising:
   a press machine including a lower die coupled to an upper die, wherein the lower die includes a top surface supporting a strip of material to be formed into a part after a stripper plate coupled to the upper die contacts the strip of material;
   a part measurement sensor located in the lower die, wherein the sensor measures a critical dimension of the part while the part is in the lower die; and
   a press controller coupled to the press machine and the sensor, wherein the controller processes a measurement signal from the part measurement sensor of the critical dimension of the part, compares the measurement signal to a predetermined threshold value, and generates a command signal to the press machine to either reject or accept the part;
   wherein the part measurement sensor generates a first measurement signal in a first half of a press machine cycle and a second measurement signal in a second half of a press machine cycle.

2. The measurement system according to claim 1, wherein the sensor is received in an aperture formed in the lower die.

3. The measurement system according to claim 2, wherein a top face of the sensor is in the same plane as the top surface of the lower die.

4. The measurement system to claim 1, wherein the sensor is an analog output proximity switch.

5. The measurement system according to claim 1, wherein the press machine is a progressive punch press.

6. A part measurement system comprising:
a press machine including a lower die coupled to an upper die, wherein the lower die includes a top surface supporting a strip of material to be formed into a part after a stripper plate coupled to the upper die contacts the strip of material;
a part measurement sensor located in the lower die, wherein the sensor measures a critical dimension of the part while the part is in the lower die; and
a press controller coupled to the press machine and the sensor, wherein the controller processes a measurement signal from the part measurement sensor of the critical dimension of the part, compares the measurement signal to a predetermined threshold value, and generates a command signal to the press machine to either reject or accept the part;
wherein the sensor generates a first measurement signal prior to the upper die punching the strip of material and a second measurement signal after the upper die punches the strip of material.

7. The measurement system according to claim 6, wherein the press controller generates an average measurement signal based on the first measurement signal and the second measurement signal.

8. The measurement system according to claim 7, wherein the press controller compares the average measurement signal to the predetermined threshold to determine whether to accept or reject the part.

9. The measurement system according to claim 6, wherein the sensor generates the first measurement signal when the press machine is between 130 degrees and 150 degrees.

10. The measurement system according to claim 9, wherein the sensor generates the second measurement signal when the press machine is between 180 degrees and 360 degrees.

11. A part measurement system comprising:
a press machine including a lower die coupled to an upper die, wherein the lower die includes a top surface supporting a strip of material to be formed into a part after a stripper plate coupled to the upper die contacts the strip of material;
a part measurement sensor located in the lower die, wherein the sensor measures a critical dimension of the part; and
a press controller coupled to the press machine and the sensor, wherein the controller processes a measurement signal from the part measurement sensor of the critical dimension of the part, compares the measurement signal to a predetermined threshold value, and generates a command signal to the press machine to either reject or accept the part;
wherein the part measurement sensor generates a first measurement signal in a first half of a press machine cycle and a second measurement signal in a second half of a press machine cycle.

12. The measurement system according to claim 11, wherein the sensor measures the critical dimension of the part while the part is in the lower die.

13. The measurement system according to claim 11, wherein the sensor is received in an aperture formed in the lower die.

14. The measurement system according to claim 13, wherein a top face of the sensor is in the same plane as the top surface of the lower die.

15. The measurement system to claim 11, wherein the sensor is an analog output proximity switch.

16. The measurement system according to claim 11, wherein the press machine is a progressive punch press.

17. A part measurement system comprising:
a press machine including a lower die coupled to an upper die, wherein the lower die includes a top surface supporting a strip of material to be formed into a part after a stripper plate coupled to the upper die contacts the strip of material;
a part measurement sensor located in the lower die, wherein the sensor measures a critical dimension of the part; and
a press controller coupled to the press machine and the sensor, wherein the controller processes a measurement signal from the part measurement sensor of the critical dimension of the part, compares the measurement signal to a predetermined threshold value, and generates a command signal to the press machine to either reject or accept the part;
wherein the sensor generates a first measurement signal prior to the upper die punching the strip of material and a second measurement signal after the upper die punches the strip of material.

18. The measurement system according to claim 17, wherein the press controller generates an average measurement signal based on the first measurement signal and the second measurement signal.

19. The measurement system according to claim 18, wherein the press controller compares the average measurement signal to the predetermined threshold to determine whether to accept or reject the part.

20. The measurement system according to claim 19, wherein the sensor generates the first measurement signal when the press machine is between 130 degrees and 150 degrees.

21. The measurement system according to claim 20, wherein the sensor generates the second measurement signal when the press machine is between 180 degrees and 360 degrees.

22. A method of measuring a critical dimension of a part in a press machine, the method including the steps of:
feeding a strip of material through the press machine, wherein the machine includes a lower die coupled to an upper die and the lower die includes a top surface supporting the strip of material;
forming the strip of material into the part, wherein a stripper plate coupled to the upper die contacts the strip of material and the upper die punches the strip of material;
measuring the critical dimension of the part with a part measurement sensor located in the lower die; and
processing a measurement signal from the part measurement sensor of the critical dimension of the part, wherein a press controller compares the measurement signal to a predetermined threshold value, and generates a command signal to the press machine to either reject or accept the part;
wherein the part measurement sensor generates a first measurement signal in a first half of a press machine cycle and a second measurement signal in a second half of a press machine cycle.

23. The method according to claim 22, wherein the sensor measures the critical dimension of the part while the part is in the lower die.

24. The method according to claim 23, wherein the sensor is received in an aperture formed in the lower die.

25. The method according to claim 24, wherein a top face of the sensor is in the same plane as the top surface of the lower die.

26. The method according to claim 22, wherein the sensor is an analog output proximity switch.

27. The method according to claim 22, wherein the press machine is a progressive punch press.

28. The method according to claim 27, wherein the sensor generates a first measurement signal prior to the upper die punching the strip of material and a second measurement signal after the upper die punches the strip of material.

29. The method according to claim 28, wherein the press controller generates an average measurement signal based on the first measurement signal and the second measurement signal.

30. The method according to claim 29, wherein the press controller compares the average measurement signal to the predetermined threshold to determine whether to accept or reject the part.

31. The method according to claim 28, wherein the sensor generates the first measurement signal when the press machine is between 130 degrees and 150 degrees.

32. The method according to claim 31, wherein the sensor generates the second measurement signal when the press machine is between 180 degrees and 360 degrees.

* * * * *